United States Patent
Verma et al.

(10) Patent No.: US 11,721,772 B2
(45) Date of Patent: Aug. 8, 2023

(54) VARACTOR WITH MEANDER DIFFUSION REGION

(71) Applicant: United Microelectronics Corp., Hsinchu (TW)

(72) Inventors: Purakh Raj Verma, Singapore (SG); Su Xing, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 17/849,718

(22) Filed: Jun. 27, 2022

(65) Prior Publication Data

US 2022/0328700 A1 Oct. 13, 2022

Related U.S. Application Data

(62) Division of application No. 16/739,022, filed on Jan. 9, 2020, now Pat. No. 11,508,855.

(30) Foreign Application Priority Data

Dec. 6, 2019 (CN) .................. 201911240649.X

(51) Int. Cl.
*H01L 29/93* (2006.01)
*H01L 29/06* (2006.01)
*H01L 29/66* (2006.01)

(52) U.S. Cl.
CPC .......... *H01L 29/93* (2013.01); *H01L 29/0688* (2013.01); *H01L 29/66174* (2013.01)

(58) Field of Classification Search
CPC .......... H01L 29/0688; H01L 29/66174; H01L 29/93–94; H01L 2924/12034; H01L 27/0808
See application file for complete search history.

(56) References Cited

U.S. PATENT DOCUMENTS

| | | |
|---|---|---|
| 5,355,008 A | 10/1994 | Moyer et al. |
| 5,563,438 A | 10/1996 | Tsang |
| 2003/0127691 A1 | 7/2003 | Yue et al. |
| 2006/0125012 A1 | 6/2006 | Fathimulla |
| 2007/0170467 A1* | 7/2007 | Tani .................. H01L 29/93 257/202 |
| 2008/0042221 A1 | 2/2008 | Tsau |
| 2016/0079444 A1 | 3/2016 | Wright |
| 2020/0287061 A1* | 9/2020 | Amirpour ............ H01L 29/93 |

* cited by examiner

*Primary Examiner* — Wasiul Haider
(74) *Attorney, Agent, or Firm* — JCIPRNET

(57) ABSTRACT

A varactor structure includes a substrate. A first and second gate structure are disposed on the substrate. The first and second gate structures each include a base portion and a plurality of line portions connected thereto. The line portions of each of the first and second gate structures is alternately arranged. A meander diffusion region is formed in the substrate and surrounds the line portions. A first set of contact plugs is planned with at least two columns or rows and disposed on the base portions of the first and second gate structures. A second set of contact plugs is planned with at least two columns or rows and disposed on the meander diffusion region. A first conductive layer is disposed on a top end of the first set of contact plugs. A second conductive layer is disposed on a top end of the second set of contact plugs.

12 Claims, 6 Drawing Sheets

VARACTOR WITH MEANDER DIFFUSION REGION

CROSS-REFERENCE TO RELATED APPLICATION

This application is a divisional application of and claims the priority benefit of U.S. application Ser. No. 16/739,022, filed on Jan. 9, 2020, now pending, which claims the priority benefit of China application serial no. 201911240649.X, filed on Dec. 6, 2019. The entirety of each of the above-mentioned patent applications is hereby incorporated by reference herein and made a part of this specification.

BACKGROUND OF THE INVENTION

Field of the Invention

The invention relates to a semiconductor fabricating technology, and in particular, to a varactor structure and a method for fabricating same.

Description of Related Art

A varactor is an element of a variable capacitor, and may be applied to, for example, a circuit operating in a millimeter wave (mm Wave) frequency band, or a mobile communications circuit. The varactor may be fabricated by using a structure of a metal oxide semiconductor (MOS). However, quality of the varactor degrades as operations increase. In a high-frequency operating range, such as greater than 5 GHz, a quality factor (Q-factor) of the varactor usually decreases greatly.

How to maintain a relatively large quality factor of a varactor at a relatively high operating frequency is a technology still to be further developed.

SUMMARY OF THE INVENTION

The invention provides a varactor structure and a method for fabricating same, which can improve quality of a varactor, thereby still maintaining required quality and improving performance of a circuit at a relatively high operating frequency.

In an embodiment, the invention provides a varactor structure. The varactor structure includes a substrate. A first gate structure and a second gate structure are disposed on the substrate. The first gate structure and the second gate structure each include a base portion and a plurality of line portions connected to the base portion. The plurality of line portions of each of the first gate structure and the second gate structure is alternately arranged. A meander diffusion region is formed in the substrate and surrounds the plurality of line portions. A first set of contact plugs is planned with at least two columns or rows, and disposed on the plurality of base portions of the first gate structure and the second gate structure. A second set of contact plugs is planned with at least two columns or rows, and disposed on the meander diffusion region. An input layer is disposed on a top end of the first set of contact plugs. An output layer is disposed on a top end of the second set of contact plugs.

In an embodiment, for the varactor structure, each of the plurality of line portions is of a single-line structure.

In an embodiment, for the varactor structure, each of the plurality of line portions includes a brunched structure at an end relative to the base portion.

In an embodiment, for the varactor structure, the base portion of the first gate structure and the base portion of the second gate structure are disposed on two sides of the meander diffusion region.

In an embodiment, for the varactor structure, the second set of contact plugs on the meander diffusion region includes at least a first group distributed along a first meander line of the meander diffusion region and a second group distributed along a second meander line of the meander diffusion region, and the first meander line is parallel to the second meander line.

In an embodiment, for the varactor structure, the first set of contact plugs on each of the base portions includes at least a first group distributed along a first extension line of each of the base portions and a second group distributed along a second extension line of each of the base portions, and the first extension line is parallel to the second extension line.

In an embodiment, the varactor structure further includes a guard ring on the substrate and surrounding the first gate structure, the second gate structure, and the meander diffusion region.

In an embodiment, the varactor structure further includes a doped well region on the substrate and below the meander diffusion region, the first gate structure, and the second gate structure.

In an embodiment, the invention also provides a varactor structure. The varactor structure includes a substrate. A first closed gate structure and a second closed gate structure are disposed on the substrate. The first closed gate structure and the second closed gate structure each include a base portion and a plurality of close loops respectively connected to the base portion. The first closed gate structure and the second closed gate structure are alternately arranged. A diffusion region is formed in the substrate and surrounds the plurality of close loops. A first set of contact plugs is planned with at least two columns or rows, and disposed on each of the base portions. A second set of contact plugs is planned with at least two columns or rows, and disposed on the diffusion region. An input layer is disposed on a top end of the first set of contact plugs. An output layer is disposed on a top end of the second set of contact plugs.

In an embodiment, for the varactor structure, the base portion of the first closed gate structure and the base portion of the second closed gate structure are disposed on two sides of the diffusion region.

In an embodiment, for the varactor structure, the diffusion region includes a first region inside the plurality of close loops and a second region outside the plurality of close loops.

In an embodiment, for the varactor structure, the second set of contact plugs includes a first group distributed in the first region of the diffusion region and constituting a two-dimensional array.

In an embodiment, for the varactor structure, the second set of contact plugs includes a second group two-dimensionally distributed in the second region of the diffusion region.

In an embodiment, for the varactor structure, the second set of contact plugs includes a second group distributed in the second region of the diffusion region and including at least a plurality of two-dimensional arrays, distributed between the plurality of close loops.

In an embodiment, for the varactor structure, the first set of contact plugs on each of the base portions includes at least a first group distributed along a first extension line of each of the base portions and a second group distributed along a second extension line of each of the base portions, and the first extension line is parallel to the second extension line.

In an embodiment, for the varactor structure, the first closed gate structure and the second closed gate structure each further include a striped portion, connected between the close loop and the base portion.

In an embodiment, the invention also provides a method for fabricating a varactor structure. The method includes: providing a substrate; forming a first gate structure and a second gate structure on the substrate, where the first gate structure and the second gate structure each include a base portion and a plurality of line portions connected to the base portion, and the plurality of line portions of each of the first gate structure and the second gate structure is alternately arranged, where the plurality of line portions of the first gate structure and the second gate structure is alternately arranged; forming a meander diffusion region in the substrate, surrounding the plurality of line portions; forming a first set of contact plugs, with at least two columns or rows, and disposed on the plurality of base portions of the first gate structure and the second gate structure; forming a second set of contact plugs, planned with at least two columns or rows, and disposed on the meander diffusion region; forming an input layer on a top end of the first set of contact plugs; and forming an output layer on a top end of the second set of contact plugs.

In an embodiment, for the method for fabricating a varactor structure, each of the plurality of line portions is of a single-line structure.

In an embodiment, for the method for fabricating a varactor structure, each of the plurality of line portions includes a brunched structure at an end relative to the base portion.

In an embodiment, for the method for fabricating a varactor structure, the base portion of the first gate structure and the base portion of the second gate structure are disposed on two sides of the meander diffusion region.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
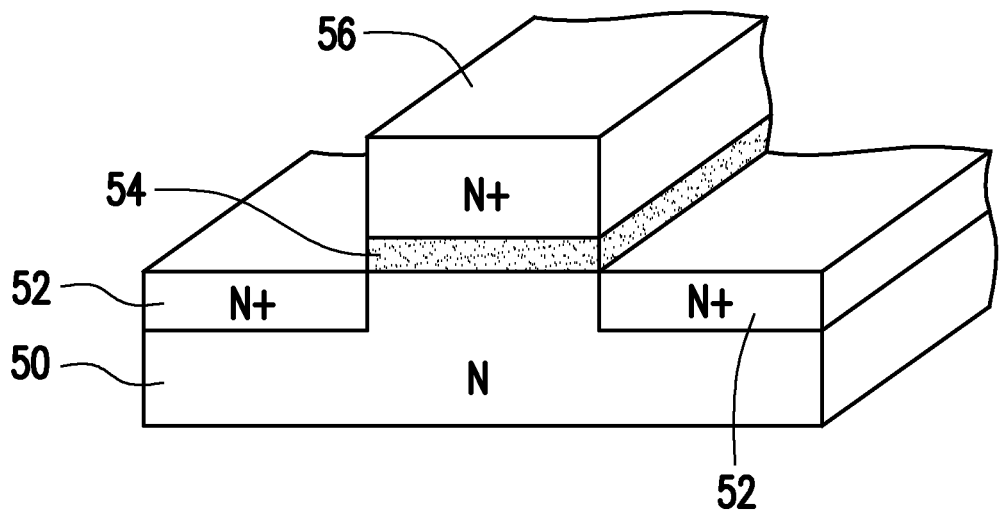
FIG. 1 is a schematic basic structural diagram of a varactor according to an embodiment of the invention.

Reference will now be made in detail to the present exemplary embodiments of the invention, examples of which are illustrated in the accompanying drawings. Wherever possible, the same reference numbers are used in the drawings and the description to refer to the same or like parts.

The invention relates to a varactor structure and a method for fabricating same. According to the varactor structure, quality of a varactor may be improved at least through planning a contact plug, thereby still maintaining required quality and improving performance of a circuit at a relatively high operating frequency.

The following describes the invention by using some embodiments. However, the invention is not limited to the listed plurality of embodiments, and the plurality of embodiments may be combined appropriately.

FIG. 1 is a schematic basic structural diagram of a varactor according to an embodiment of the invention. Referring to FIG. 1, a varactor structure is, for example, formed by a MOS structure. A gate structure is formed on a substrate 50, and includes a gate insulation layer 54 and a gate layer 56 on the gate insulation layer 54. In an embodiment, the substrate 50 shown herein may alternatively represent a doped well region on a silicon substrate. The substrate 50 is, for example, a doped region of an N conductive type. Similar to the MOS structure, a diffusion region 52 is formed on each of the substrates 50 at two sides of the gate layer 56. In an embodiment, the diffusion region 52 is a region doped with a high concentration of N conductive type, N+. Therefore, the diffusion region 52 and the substrate 50 are of a same conductive type, for example, the N conductive type. The gate insulation layer 54 is, for example, an oxide layer, used as a dielectric material for a capacitor. The gate layer 56 is, for example, a poly-silicon material.

FIG. 1 shows a basic varactor structure, and the gate layer 56 is an electrode of the capacitor, and is, for example, an input electrode. The diffusion region 52 surrounds the gate layer 56, and is used as an output electrode. The diffusion region 52 surrounds the gate layer 56 and is subsequently connected to an electrode tip of an external circuit by using a contact plug. However, an overall structure of a connection to the external circuit by using the contact plug may generate a parasitic capacitance and a parasitic resistance, causing an unnecessary coupling effect. Such a coupling effect may lead to degradation in quality of the varactor during high-frequency operation.

The invention looks into degradation of quality of a common varactor during high-frequency operation and then provides an overall structure of a varactor.

Figure 2:
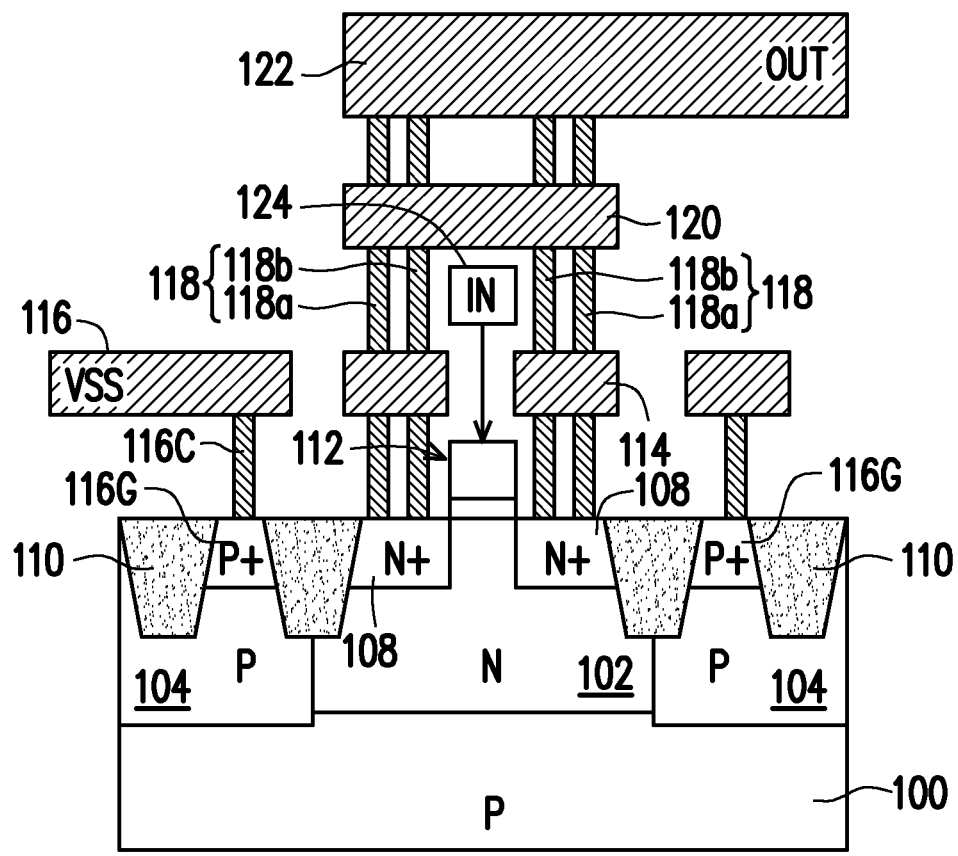
FIG. 2 is a schematic cross-sectional structural diagram of a varactor according to an embodiment of the invention.
Figure 3:
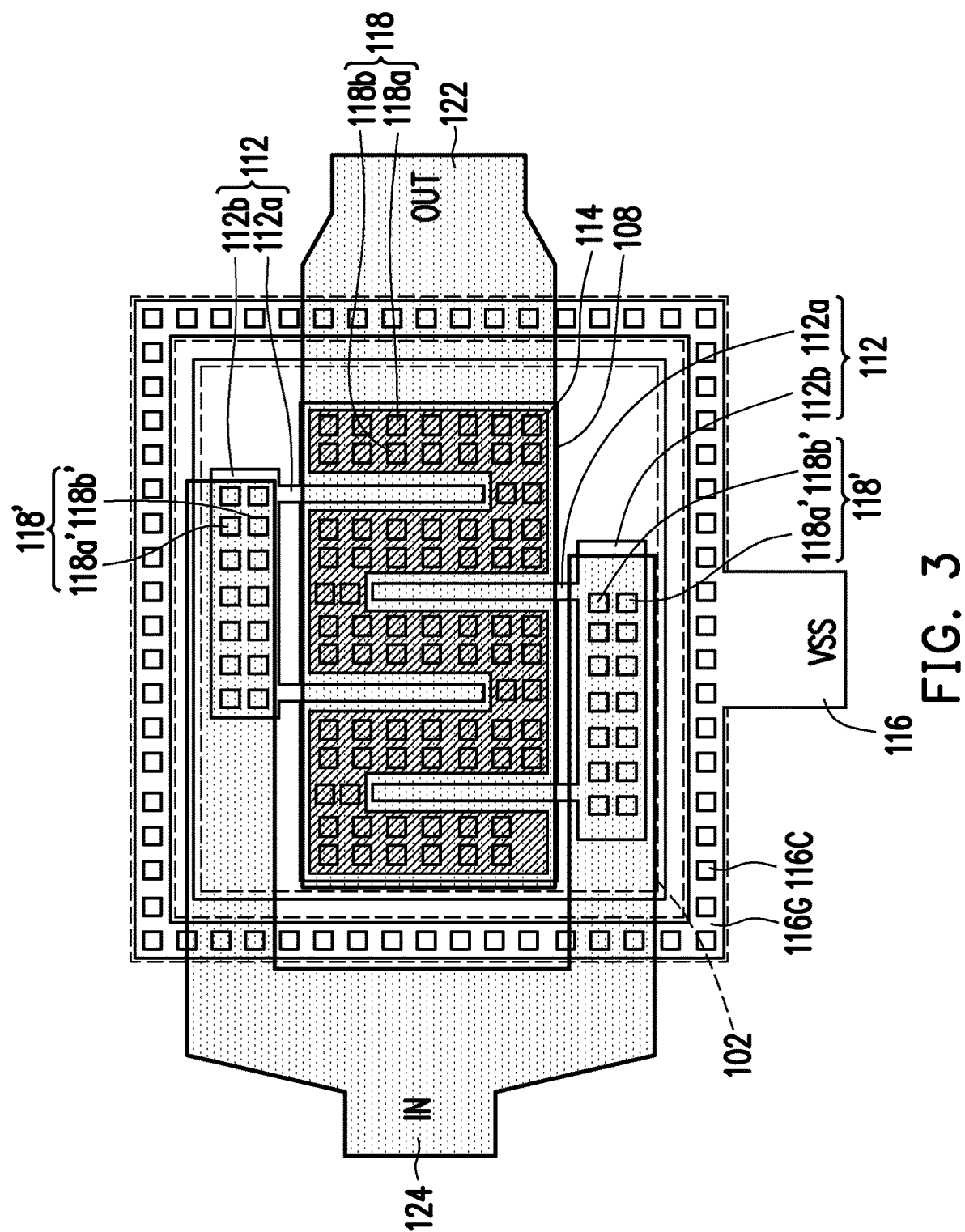
FIG. 3 is a schematic top-view structural diagram of a varactor according to an embodiment of the invention.

FIG. 2 is a schematic cross-sectional structural diagram of a varactor according to an embodiment of the invention. FIG. 3 is a schematic top-view structural diagram of a varactor according to an embodiment of the invention. FIG. 2 is a schematic cross-sectional view of a gate structure 112 in FIG. 3.

Referring to FIG. 2 and FIG. 3, a doped well region 102 is formed on a substrate 100, for example, a well region of an N conductive type. In an embodiment, the doped well region 102 may be used as an active region. On the periphery of the doped well region 102, a doped well region 104 of a P conductive type may alternatively be formed according to an actual need, and the conductive type of the doped well region 104 is opposite to that of the doped well region 102. An isolation structure 110 is also formed on the substrate 100 to provide appropriate isolation. The gate structure 112 is formed on the doped well region 102 of the substrate 100 and includes a gate insulation layer and a gate layer on the gate insulation layer. In an embodiment, the gate structure 112 may further include a gap wall on a side wall. The gate structure 112 is, for example, used as an input terminal IN, and as to be described below, is to be connected to a conductive layer 124 at the top. A diffusion region 108 with a relatively high concentration N+is formed in the doped well region 102. The diffusion region 108 is, for example, used as an output end of the varactor. Therefore, an input end and an output terminal are determined according to an operation mechanism of a circuit, are not limited to the listed embodiment, may be interchanged as needed, and do not need to be limited. In addition, a guard ring 116G may further be formed in the doped well region 104 according to an actual need, and the guard ring 116G is, for example, a doped ring of a P conductive type.

In addition, it should be further noted that, according to a semiconductor fabricating technology, during formation of a desired element structure, formation of an internal dielectric layer is included, to assist in formation and support of the structure to be formed. The internal dielectric layer covers the formed structure. In the following description, the description of the internal dielectric layer is omitted, and the figure illustrates only the structure of the element and does not show the internal dielectric layer.

From a profile structure of FIG. 2, the diffusion region 108 is on both sides of the gate structure 112. However, from a top view of FIG. 3, in an embodiment, the diffusion region 108 is a meander diffusion region, formed in the substrate 100, and surrounds a plurality of line portions 112b of the gate structure 112. In terms of a geometric shape, the meander diffusion region may be a snake-shaped diffusion region.

The line portion 112b of the gate structure 112 is connected to a base portion 112a of the gate structure 112. In an embodiment, the entire gate structure includes two gate structures 112, disposed on the substrate 100. The two gate structures 112 may be referred to as a first gate structure and a second gate structure, arranged facing each other. The two gate structures 112 each include a base portion 112b and a plurality of line portions 112a connected to the base portion 112b, where the plurality of line portions 112a of the two gate structures 112, or the first gate structure and the second gate structure, is alternately arranged. A meander diffusion region 108 is formed in the substrate 100, and surrounds the plurality of line portions 112a. A quantity of the line portions 112a is determined according to an actual condition. In the embodiment of FIG. 3, that one gate structure 112 includes two line portions 112a is used as an example for description. In addition, there may be alternatively a gap wall on a side wall of the gate structure 112, for example, a side wall of the line portion 112a.

In an embodiment, each of the plurality of line portions 112a is of a single-line structure. In an embodiment, each of the plurality of line portions 112a includes a brunched structure at an end relative to the base portion 112b.

After being formed, the gate structure 112 and the diffusion region 108 need to be connected to an external circuit. Considering improvement of overall operating quality of the varactor, the invention provides a solution of pulling actual connection ends of the gate structure 112 and the diffusion region 108 to the top end of the entire element structure, thereby reducing a resistive coupling effect and/or a capacitive coupling effect of a connection line. It may be seen from the cross-sectional view of FIG. 2 that, for example, the conductive layer 122 used as an output may enable the diffusion region 108 to be connected to the conductive layer 122 that is used as an output layer (OUT) at the top end by using a set of contact plugs 118. Because a distance from the diffusion region 108 to the conductive layer 122 is relatively large, the middle part of the diffusion region 108 may be achieved by using a plurality of segments of plugs and conductive layers in coordination with fabrication of other elements. For example, the contact plug 118 is connected to the conductive layer 122 at an upper end by using a plurality of segments of the conductive layer 114 and the conductive layer 120.

In an embodiment, the gate structure 112 is used as an input end IN, a height of an input conductive layer 124 is not shown in the cross-sectional view of FIG. 2. Viewed from the top view of FIG. 3, the conductive layer 122 and the conductive layer 124 are the same in conductivity height in fabricating and are, for example, metal layers, formed in a same fabricating process.

The following continues to describe plans of the contact plug 118 and a contact plug 118' provided in the invention. The contact plug 118 and the contact plug 118' are configured to respectively connect the diffusion region 108 and the gate structure 112 to a line structure of an input end IN and an output end OUT, which is also an internal connection line structure. The contact plug 118 and the contact plug 118' provided in the invention are both planned to include at least two columns or two rows of distribution.

Referring to FIG. 3, a set of contact plugs 118 connected to the meander diffusion region 108 includes a plurality of contact plugs 118. These contact plugs 118 are arranged with the meander diffusion region 108. A set of contact plugs 118 on the meander diffusion region 118 includes at least a first group 118a distributed along a first meander line of the meander diffusion region 108 and a second group 118b distributed along a second meander line of the meander diffusion region 108. The first meander line is parallel to the second meander line, which includes distributions of two columns or two rows in terms of distributions of columns or rows. In an embodiment, in addition to the distribution along the first meander line and the second meander line, there may be other distributions, for example, a distribution along a third meander line or individual distributions in some regions. The invention is not limited to other additional distributions.

A set of contact plugs 118' connected to the gate structure 112 includes at least a first group distributed along a first extension line of the base portion 112b and a second group distributed along a second extension line of the base portion 112b. The first extension line is parallel to the second extension line, which includes distributions of two columns or two rows in terms of distributions of columns or rows. In addition to the distribution along the first extension line and the second extension line, there may be other distributions, for example, a distribution along a third extension line or individual distributions in some regions. The invention is not limited to other additional distributions.

The contact plugs 118 and 118' need to be extended from the substrate 100 to the conductive layers 122 and 124 at the top end, and their distances may be very long. Therefore, the conductive layer 114 and the conductive layer 120 may be formed in a relay manner in coordination with element fabricating in other regions, to connect a plurality of segments of contact plugs 118 and 118'. The invention is not limited to a particular disposition of the conductive layer 114 and the conductive layer 120. The conductive layer 114 and the conductive layer 120 are, for example, metal layers, and are completed in a same fabricating process during formation of an internal connection line structure.

In addition, the guard ring 116G is connected to the conductive layer 116 by using the contact plug 116C, to receive a low voltage VSS. A height of the conductive layer 116 may not need to be equal to those of the conductive layers 122 and 124.

Figure 4A:
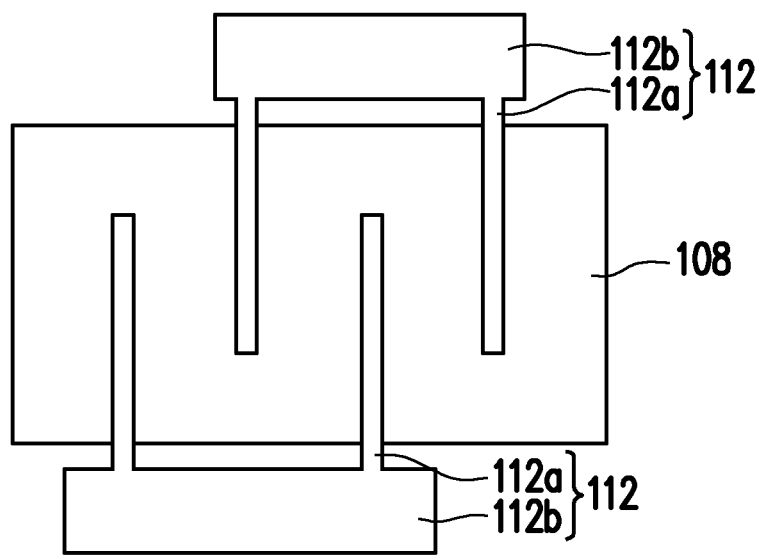
FIG. 4A to FIG. 4C are each a schematic plane diagram of some components of a varactor according to an embodiment of the invention.
Figure 4B:
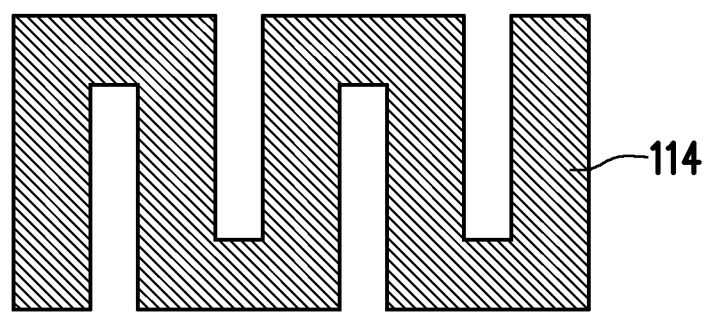
Figure 4C:
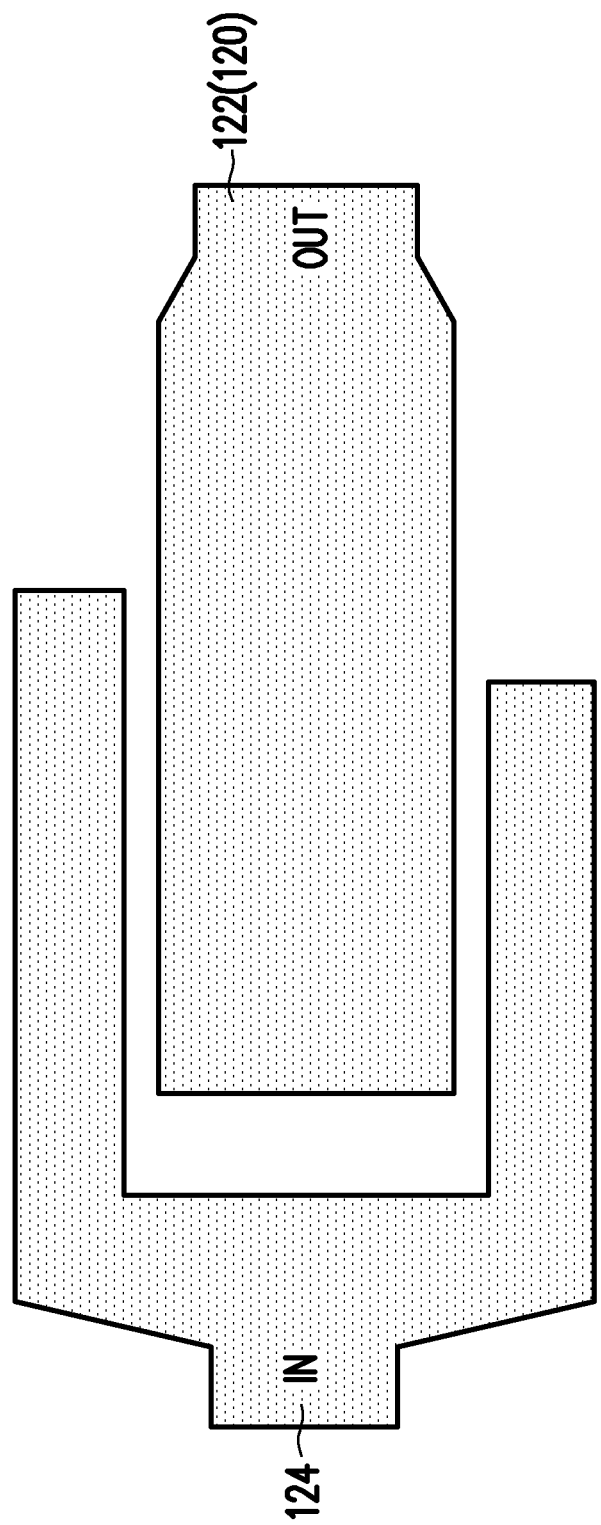

FIG. 4A to FIG. 4C are each a schematic plane diagram of some components of a varactor according to an embodiment of the invention. Referring to FIG. 4A, FIG. 2, and FIG. 3, as described above, the gate structure 112 on the substrate includes the plurality of line portions 112a and the base portion 112b. The two gate structures 112 are at two sides of the meander diffusion region 108. The plurality of line portions 112a is alternately arranged. The diffusion region 108 surrounds the plurality of line portions 112a to constitute a meander structure. The diffusion region 108 is formed, for example, after the gate structure 112 by using the gate structure 112 as a mask and doping the substrate 100 with a relatively high concentration N+.

Referring to FIG. 4B, FIG. 2, and FIG. 3, in an embodiment, the conductive layer 114 may have a same meander structure as the diffusion region 108, but the invention is not limited to the embodiment, and other geometric structures may be used. The conductive layer 114 is a relay connection of the contact plug 118.

Referring to FIG. 4C, FIG. 2, and FIG. 3, the conductive layer 122 and the conductive layer 124 are at the top end and are at the same height. In an embodiment, for used of the varactor, the conductive layer 122 is, for example, used as an output layer, and the conductive layer 124 is, for example, used as an input layer. In addition, the conductive layer 120 used for connecting to the contact plug 118 in the relay manner is also under the conductive layer 122. Similarly, the conductive layer used for connecting to the contact plug 118' in the relay manner is also disposed under the conductive layer 124. The invention is not limited to the manner of the listed embodiment.

Figure 5:
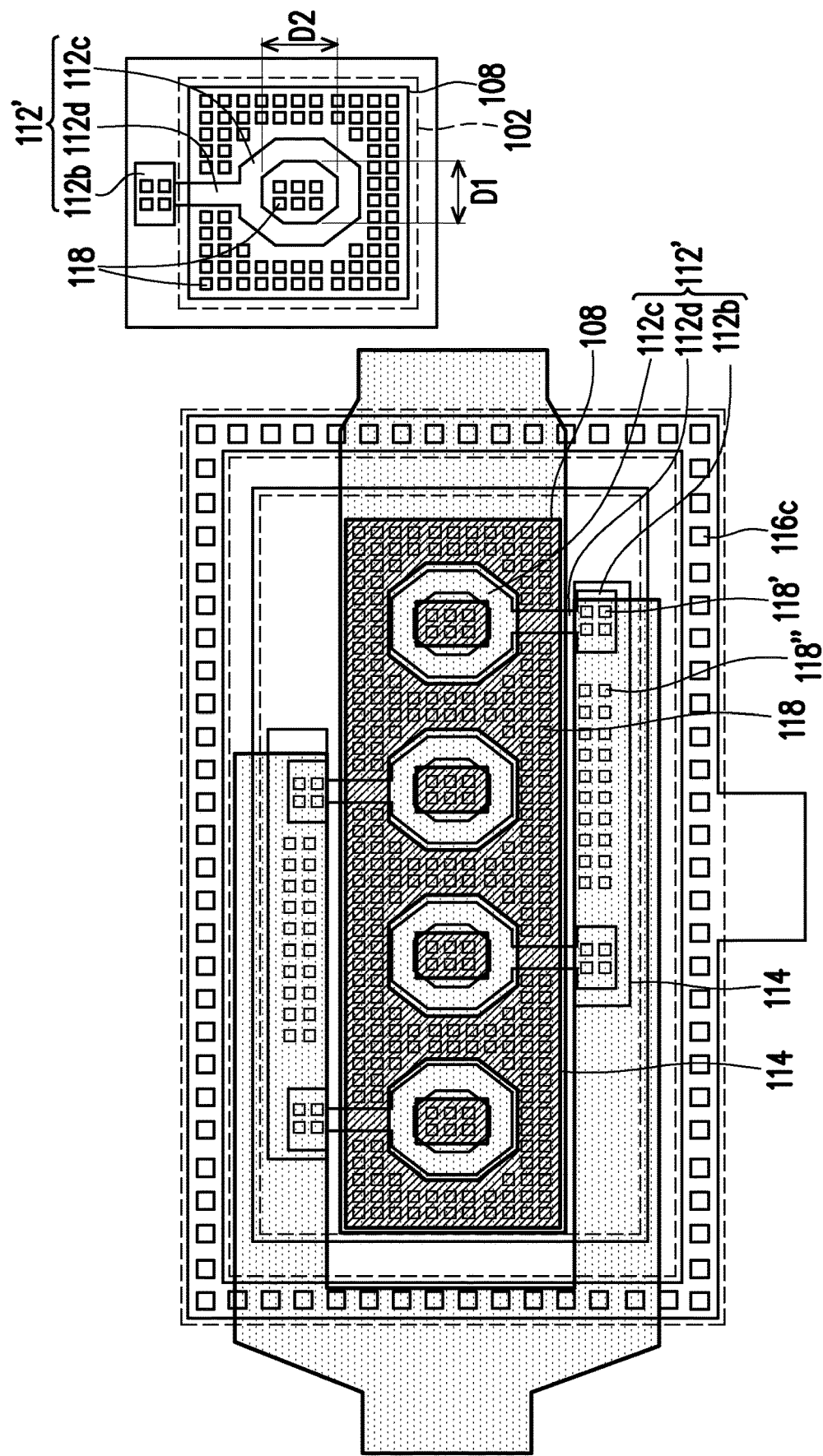
FIG. 5 is a schematic top-view structural diagram of a varactor according to an embodiment of the invention.

Based on an effect of reducing resistive and capacitive couplings, the structure of FIG. 3 may be further modified. FIG. 5 is a schematic top-view structural diagram of a varactor according to an embodiment of the invention.

Referring to FIG. 5, in an embodiment, a gate structure 112' includes a base portion 112b and a plurality of closed gate structures connected to the base portion 112b. An upper right part of FIG. 5 shows a distribution manner for the gate structure 112' and its surrounding contact plugs. In an embodiment, the closed gate structures include, for example, close loops 112c, respectively connected to the base portion 112b.

A plurality of close loops 112c belonging to two gate structures 112' is also alternately arranged. In addition, the closed gate structure may further include, for example, a striped portion 112d, connected between the base portion 112b and the close loop 112c, but the invention is not limited to the disposition of the striped portion 112d.

Because the closed gate structure includes the close loop 112c, a diffusion region 108 is no longer of a meander shape compared with FIG. 3, but still surrounds the gate structure 112', where one part of the diffusion region 108 is inside the close loop 112c and one part of the diffusion region 108 is outside the close loop 112c.

In the present embodiment, there are also two gate structures 112' on two sides of the diffusion region 108, a plurality of close loops 112c respectively belonging to the two gate structures 112' is also alternately arranged, and details thereof are omitted herein. A geometric shape of the close loop 112c is not limited to the listed embodiment. In an embodiment, the close loop 112c is, for example, of a polygonal shape, or a smooth close loop. In an embodiment, the close loop 112c can be formed as long as its size meets an element design rule, for example, a width D1 and a length D2 of the close loop 112c can meet the element design rule.

In coordination with the diffusion region 108 and the gate structure 112', two sets of contact plugs are still maintained for distribution. One set of contact plugs 118' is planned with at least two columns or rows, and disposed on the base portion 112b of each gate structure 112'. The other set of contact plugs 118 is also planned with at least two columns or rows, and is disposed on the diffusion region 108. One part of the diffusion region 108 is inside the close loop 112c and one part of the diffusion region 108 is outside the close loop 112c.

Referring to the structure in FIG. 2, the contact plug 118 or 118' may have a plurality of segments and be connected to the conductive layer 122 or 124 that is, for example, used as an input layer IN or an output layer OUT by using the conductive layer 114 and the conductive layer 120 that are connected in a relay manner.

In an embodiment, the base portion 112b of the gate structure 112 or 112' may be an integrally connected layer or a plurality of separate regions corresponding to the close loop 112c. The invention is not limited to the disposition manner of the base portion 112b of the gate structure 112 or 112'. However, the contact plugs 118' on the base portion 112b are in at least two columns or two rows. In an embodiment, the contact plugs 118' on the base portion 112b are two-dimensionally distributed. Similarly, the contact plugs 118 on the diffusion region 108 are also two-dimensionally distributed. In addition, if the base portions 112b of the gate structures 112' are separately, some auxiliary contact plug 118" may be disposed between the conductive layer 114 and the conductive layer 120. The planning of the contact plug in the invention is not limited to the listed embodiment.

Figure 6A:
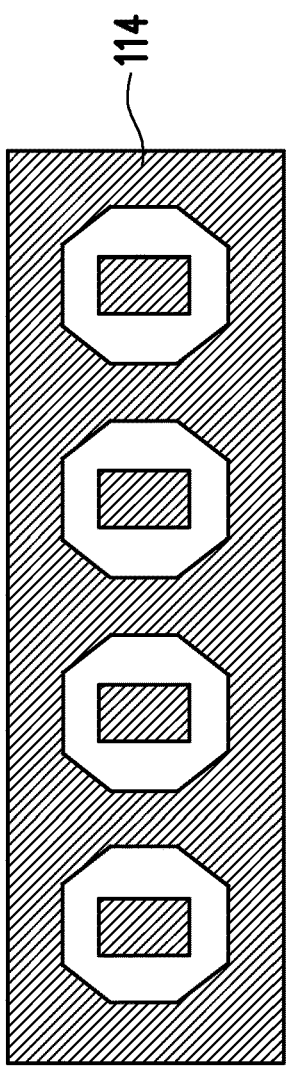
FIG. 6A and FIG. 6B are each a schematic plane diagram of some components of a varactor according to an embodiment of the invention.
Figure 6B:
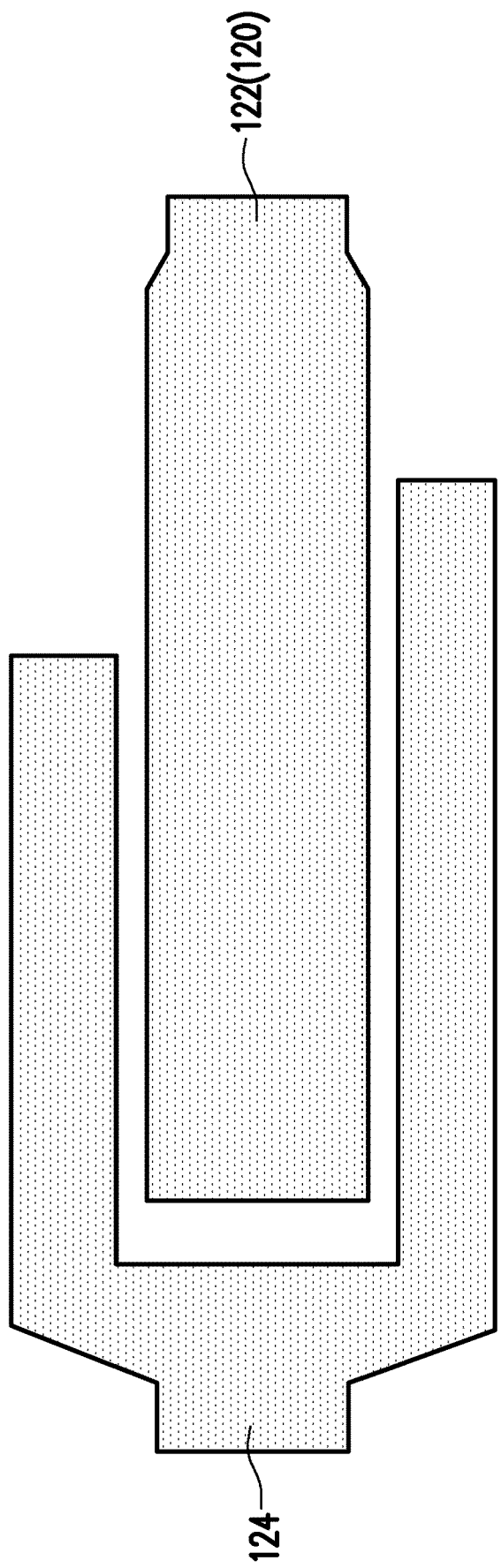

FIG. 6A and FIG. 6B are each a schematic plane diagram of some components of a varactor according to an embodiment of the invention. Referring to FIG. 6A, FIG. 2, and FIG. 5, the gate structure 112' includes the structure of the close loop 112c, and the diffusion region 108 is not distributed in a meander structure. Therefore, a geometric shape of the conductive layer 114 in a relay connection may be, for example, adjusted correspondingly. The conductive layer 114 and the diffusion region 108 are connected to each other by using a segment of the contact plug 118.

Referring to FIG. 6B, the conductive layer 122 and the conductive layer 124 are at an upper layer of the varactor, and are used, for example, as an input end and an output end, to be connected to an external circuit. The structure of the varactor in the present embodiment may reduce a resistive coupling effect.

The invention also provides a method for fabricating a varactor structure. The method includes: providing a substrate 100; forming a first gate structure 112 and a second gate structure 112 on the substrate 100, where the first gate structure 112 and the second gate structure 112 each include a base portion 112b and a plurality of line portions 112a connected to the base portion 112b, and the plurality of line portions 112a of each of the first gate structure and the second gate structure is alternately arranged, and the plurality of line portions of each of the first gate structure 112 and the second gate structure 112 is alternately arranged; forming a meander diffusion region 108 in the substrate 100, surrounding the plurality of line portions 112a; forming a first set of contact plugs 118', with at least two columns or rows, and disposed on the plurality of base portions 112b of the first gate structure 112 and the second gate structure 112; forming a second set of contact plugs 118, planned with at least two columns or rows, and disposed on the meander diffusion region 108; forming a first conductive layer 124 on a top end of the first set of contact plugs; and forming a second conductive layer 122 on a top end of the second set of contact plugs.

The overall structure of the varactor provided in the invention includes adjustment of the gate structure and planning of the contact plug, and the gate and the diffusion region of the varactor may be lifted to the top end of the element as an input end and an output end to be connected to an external circuit. Quality of the varactor may be improved, thereby reducing generally rapid degradation in a quality factor with an increase in operating frequency.

Finally, it should be noted that the foregoing embodiments are merely intended for describing the technical solutions of the invention, but not for limiting the invention. Although the invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A varactor structure, comprising:
    a substrate;
    a first gate structure and a second gate structure, disposed on the substrate, wherein the first gate structure and the second gate structure each comprise a base portion and a plurality of line portions connected to the base portion, and the plurality of line portions of each of the first gate structure and the second gate structure is alternately arranged;
    a meander diffusion region, formed in the substrate, and surrounding the plurality of line portions;
    a first set of contact plugs, planned with at least two columns or rows, and disposed on the plurality of base portions of the first gate structure and the second gate structure;
    a second set of contact plugs, planned with at least two columns or rows, and disposed on the meander diffusion region;
    a first conductive layer, disposed on a top end of the first set of contact plugs; and
    a second conductive layer, disposed on a top end of the second set of contact plugs.

2. The varactor structure according to claim 1, wherein each of the plurality of line portions is of a single-line structure.

3. The varactor structure according to claim 1, wherein each of the plurality of line portions comprises a branched structure at an end relative to the base portion.

4. The varactor structure according to claim 1, wherein the base portion of the first gate structure and the base portion of the second gate structure are disposed on two sides of the meander diffusion region.

5. The varactor structure according to claim 1, wherein the second set of contact plugs on the meander diffusion region comprises at least a first group distributed along a first meander line of the meander diffusion region and a second group distributed along a second meander line of the meander diffusion region, and the first meander line is parallel to the second meander line.

6. The varactor structure according to claim 1, wherein the first set of contact plugs on each of the base portions comprises at least a first group distributed along a first extension line of each of the base portions and a second group distributed along a second extension line of each of the base portions, and the first extension line is parallel to the second extension line.

7. The varactor structure according to claim 1, further comprising a guard ring on the substrate and surrounding the first gate structure, the second gate structure, and the meander diffusion region.

8. The varactor structure according to claim 1, further comprising a doped well region on the substrate and below the meander diffusion region, the first gate structure, and the second gate structure.

9. A method for fabricating a varactor structure, comprising:
    providing a substrate;
    forming a first gate structure and a second gate structure on the substrate, wherein the first gate structure and the second gate structure each comprise a base portion and a plurality of line portions connected to the base portion, and the plurality of line portions of each of the first gate structure and the second gate structure is alternately arranged, wherein the plurality of line portions of the first gate structure and the second gate structure is alternately arranged;
    forming a meander diffusion region in the substrate, surrounding the plurality of line portions;
    forming a first set of contact plugs, with at least two columns or rows, and disposed on the plurality of base portions of the first gate structure and the second gate structure;
    forming a second set of contact plugs, planned with at least two columns or rows, and disposed on the meander diffusion region;
    forming a first conductive layer, disposed on a top end of the first set of contact plugs; and
    forming a second conductive layer, disposed on a top end of the second set of contact plugs.

10. The method for fabricating a varactor structure according to claim 9, wherein each of the plurality of line portions is of a single-line structure.

11. The method for fabricating a varactor structure according to claim 9, wherein each of the plurality of line portions comprises a branched structure at an end relative to the base portion.

12. The method for fabricating a varactor structure according to claim 9, wherein the base portion of the first gate structure and the base portion of the second gate structure are disposed on two sides of the meander diffusion region.

* * * * *